United States Patent [19]

Falkenstein et al.

[11] Patent Number: 4,834,490
[45] Date of Patent: May 30, 1989

[54] TRANSMITTING RECEIVING DEVICE WITH A DIODE MOUNTED ON A SUPPORT

[75] Inventors: Rudolf Falkenstein, Freising; Franz Taumberger; Reiner Trommer, both of Munich, all of Fed. Rep. of Germany

[73] Assignee: Siemens Aktiengesellschaft, Berlin and Munich, Fed. Rep. of Germany

[21] Appl. No.: 805,244

[22] Filed: Dec. 3, 1985

Related U.S. Application Data

[63] Continuation of Ser. No. 551,522, Nov. 14, 1983, abandoned.

[30] Foreign Application Priority Data

Dec. 3, 1982 [DE] Fed. Rep. of Germany ......... 324482

[51] Int. Cl.$^4$ .................. G02B 6/36; H01J 5/16; H01L 33/00
[52] U.S. Cl. ................. 350/96.20; 350/96.10; 350/96.17; 250/227; 250/339; 357/17
[58] Field of Search ............... 350/96.10, 96.15, 96.16, 350/96.17, 96.20, 96.21; 250/227, 239; 372/5, 6, 44; 357/17, 19

[56] References Cited

U.S. PATENT DOCUMENTS

| | | | |
|---|---|---|---|
| 3,663,822 | 5/1972 | Uchida | 350/96.20 |
| 3,809,908 | 5/1974 | Clanton | 250/227 |
| 4,296,998 | 10/1981 | Dufft | 350/96.17 X |
| 4,357,072 | 11/1982 | Goodfellow et al. | 350/96.20 |
| 4,399,541 | 8/1983 | Kovats et al. | 372/6 |
| 4,413,881 | 11/1983 | Kovats | 350/96.20 |
| 4,591,711 | 5/1986 | Taumberger | 250/227 |
| 4,699,456 | 10/1987 | Mackenzie | 350/96.20 |
| 4,707,066 | 11/1987 | Falkenstein et al. | 350/96.20 |
| 4,707,067 | 11/1987 | Haberland et al. | 350/96.20 |
| 4,720,163 | 1/1988 | Goodwin et al. | 350/96.20 |
| 4,733,932 | 3/1988 | Frenkel et al. | 350/96.20 |
| 4,756,592 | 7/1988 | Sasayama et al. | 350/96.20 |
| 4,767,174 | 8/1988 | Carenco et al. | 350/96.20 |
| 4,778,241 | 10/1988 | Haltenorth | 350/96.20 |
| 4,803,689 | 2/1989 | Shibanuma | 350/96.20 |
| 4,807,956 | 2/1989 | Tournereau et al. | 350/96.20 |

FOREIGN PATENT DOCUMENTS

| | | | |
|---|---|---|---|
| 1108900 | 9/1981 | Canada | 350/96.20 |
| 2064295 | 7/1971 | Fed. Rep. of Germany | 350/96.41 |
| 2430091 | 1/1975 | Fed. Rep. of Germany | 350/96.21 |
| 2618095 | 11/1977 | Fed. Rep. of Germany | 350/96.20 |
| 2704140 | 8/1978 | Fed. Rep. of Germany | 350/96.20 |
| 55-22709 | 2/1980 | Japan | 350/96.20 |
| 2053563 | 2/1981 | United Kingdom | 350/96.20 |
| 2065918 | 7/1981 | United Kingdom | 350/96.20 |

OTHER PUBLICATIONS

"Coupling of an Optical Fibre to a Substrate Entry Photodiode", Electronics Letters, Oct. 29th 1981, vol. 17, No. 22, pp. 832 to 833.

R. Trommer and W. Kunkel; Siemens Research and Development Reports, vol. 11, No. 4, pp. 204–208 and 216 to 220.

B. M. MacDonald et al., "Coupling of an Optical Fibre to a Substrate Entry Photodiode" Electronics Letters, Oct, 29, 1981, vol. 17, No. 22, pp.832 and 833.

"Verbindungstechnik uer Optische Fasern", by U. Boettcher, Nachrichten Elektronik 36 (1982), pp. 250 to 254.

"The Most Often Asked Questions on Soldering", by H. Manko, Electronic Packaging and Production, May 1965, pp. 132 and 135.

Primary Examiner—William L. Sikes
Assistant Examiner—Brian M. Healy
Attorney, Agent, or Firm—Jeffrey P. Morris

[57] ABSTRACT

Transmitting/receiving device with a diode and an optical fiber optically coupled to an optical window of the diode, where the diode is positioned on a support with a lead-in for inserting the optical fiber. For such a transmitting/receiving device the optical fiber of the diode can be easily and accurately adjusted and subsequently permanently positioned. The invention makes provisions for a cone-shaped lead-in with the diode located at the larger opening of the lead-in. This results in an especially easy adjustment of the optical fiber with respect to the diode. The device can be used in optoelectronic receivers having a so-called "pigtail" connection.

7 Claims, 4 Drawing Sheets

4,834,490

TRANSMITTING RECEIVING DEVICE WITH A DIODE MOUNTED ON A SUPPORT

CROSS-REFERENCE

This is a continuation of Ser. No. 551,522 filed Nov. 14, 1983, now abandoned.

BACKGROUND OF THE INVENTION

The invention involves a transmitting/receiving device with a transmitting and receiving diode mounted on a support and with an optical fiber optically coupled to an optical window of the diode. The support is provided with a lead-in for inserting the optical fiber, and the diode is mounted on the support such that the optical window of the diode is positioned at the lead-in.

Electronics Letters, Vol. 17, No. 22, page 832, discloses a receiving device in which the receiving diode is mounted on a ceramic block which is provided with a small hole for the insertion of the glass fiber. After the diode has been positioned above the hole, the glass fiber is inserted into the block.

A PIN photodiode, which has a ring-shaped cathode connecting surface around a circular window and an anode connecting surface opposite the optical window, is disclosed in Siemens Research and Development Reports, Vol. 11, (1982), No. 4, pages 204 to 208 and 216 to 220.

SUMMARY OF THE INVENTION

The object of the invention is to develop a receiving device in which an optical fiber can be accurately adjusted and subsequently permanently positioned in front of the window of the PIN photodiode in the simplest way possible.

Based on the invention, the transmitting/receiving device includes a support that is mechanically connected to a circuit module, and an optical fiber that is connected to the optical window via a positioning device which is also mounted on the circuit module and through the lead-in. The optical fiber is permanently positioned so that the front side of the optical fiber is a predefined distance from the optical window. The lead-in is cone-shaped, and the diode is positioned on the side of the support on which the face of the conical lead-in with the larger of the two openings is located.

The configuration allows easy adjustment of the optical fiber with respect to the diode. It also prevents damage to the end surface of the glass fiber which may occur during adjustment by lateral shifting.

For practical purposes, the optical fiber is permanently positioned with reference to the PIN photodiode after it has been adjusted. For this purpose, the receiving device is preferably constructed so that the support is square-shaped and is mounted vertically on a base plate. In a preferred embodiment the support is plate-shaped. The base plate supports a block which forms the positioning device on the side away from the PIN diode, on which the optical fiber is permanently positioned by soldering without flux material.

For practical purposes, the optical fiber is first adjusted for optimum light coupling into the PIN diode and is subsequently permanently positioned on the positioning device.

The lead-in is preferably produced by drilling a hole with a laser beam.

In a further development of the invention, the receiving device is designed so that the PIN photodiode exhibits a ring-shaped cathode connecting surface around a circular optical window and has an anode connecting surface opposite the optical window. The cathode connecting surface is bonded to an electrical conductor on the support by means of an electro-conductive adhesive, and to an additional electrical conductor on the support by means of a bond pad.

The receiving device is designed so that the angle brackets, provided for the mechanical attachment of the support to the circuit module, include an electro-conductive material and are electrically connected to the electrical conductors or conductor tracks of the support as well as to electrical conductors or conductor tracks of the circuit module. In this case, the brackets are also used as electrical connecting elements for the PIN photodiode.

Other features and advantages of the present invention will become apparent from the following detailed description, and from the claims.

For a full understanding of the present invention, reference should now be made to the following detailed description and to the accompanying drawings.

BRIEF DESCRIPTION OF THE DRAWINGS

The invention is explained further by means of the embodiments shown in the following figures.

DETAILED DESCRIPTION

Figure 1:
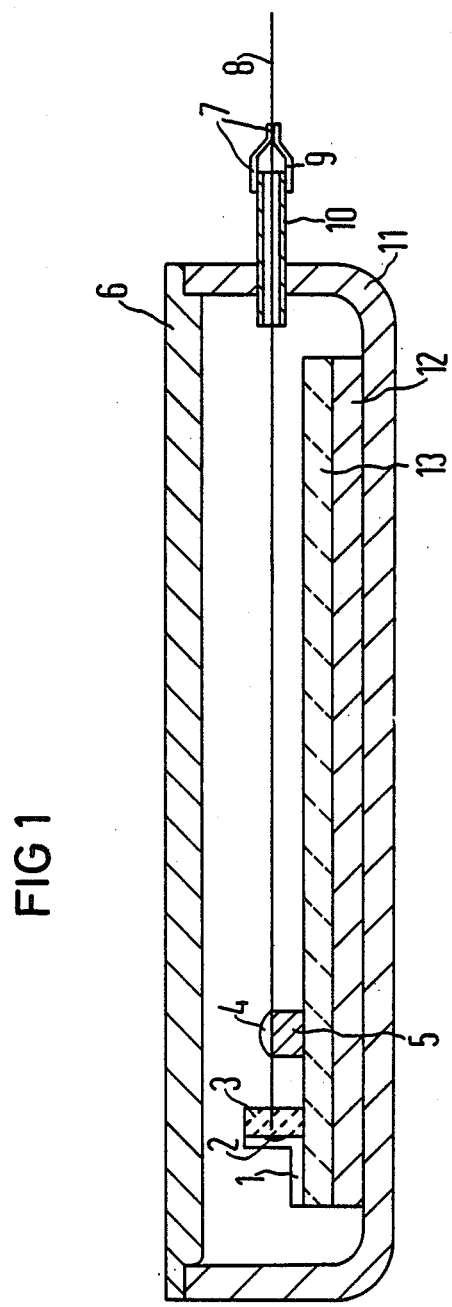
FIG. 1 is a cross-sectional view of a receiving device with a circuit module and a PIN photodiode.

FIG. 1 shows a receiving device with receiving module 13 which is located in hermetically sealed metal casing 11 and which has an optical fiber connecting device for optical coupling. The hermetic encapsulation is especially practical when using unshielded semiconductor chips in the circuit module.

The receiving device is located in metal casing 11 which is sealed with lid 6. On the bottom of square-shaped metal casing 11 is spacer 12. Spacer 12 supports circuit module 13 which is plate-shaped and which is positioned parallel to the bottom of metal casing 11 at a distance predefined by spacer 12.

Tubing 10 is mounted in a side wall of metal casing 11, so that it protrudes from the side wall on both the inside and outside. A ferrule-type connecting piece 9 is attached to tubing 10 which protrudes from the inside; the larger opening of the connecting piece is mounted over the tubing while the optical fiber 8 is inserted into the smaller end of this connecting piece. Optical fiber 8 passes through connecting piece 9 and tubing 10, over block 5 and through an opening in diode support 3 to the optical window of PIN photodiode 2. Optical fiber 8 is made of glass fiber and is permanently positioned on block 5 and on the inside of connecting piece 9 at the end of the ferrule-type connecting piece with the smaller inside diameter.

Diode support 3 is fastened to circuit module 13 with two metal angle brackets 1. These two metal angle brackets 1, of which only one is visible in FIG. 1, are positioned next to PIN diode 2.

Figure 2:
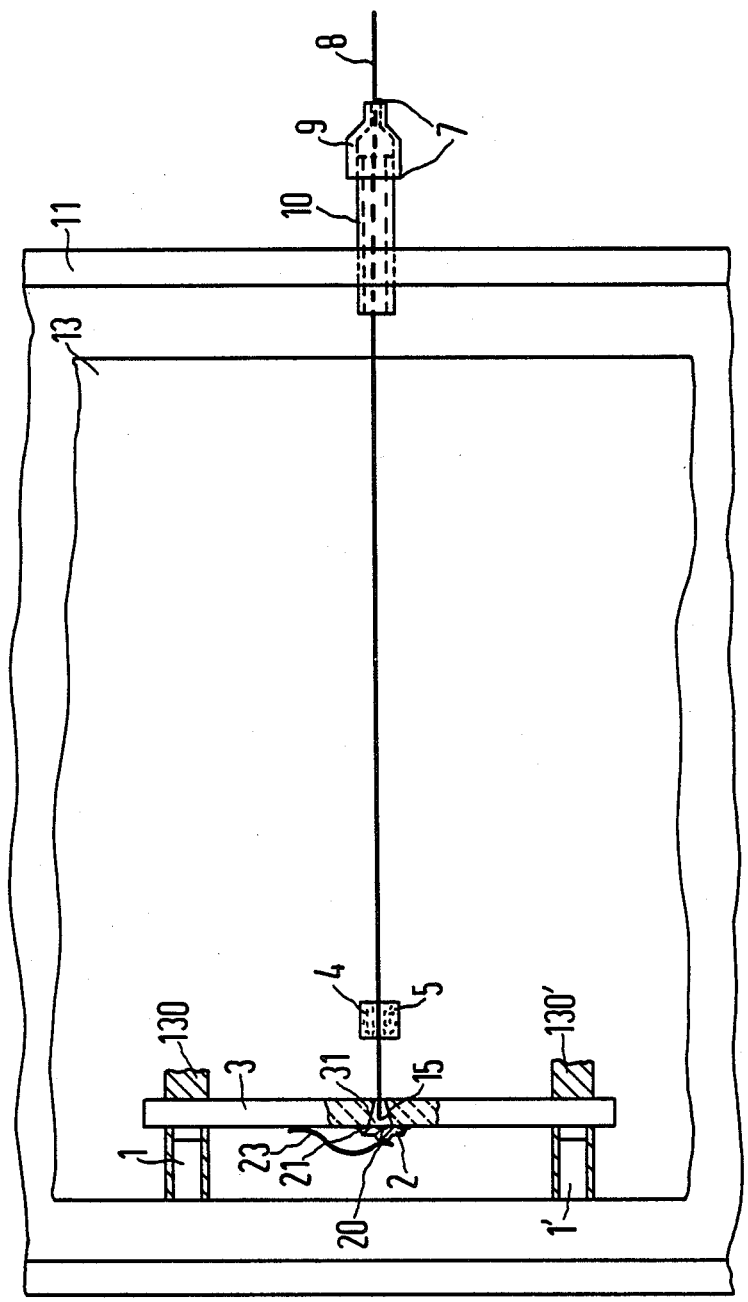
FIG. 2 is a topview of the receiving device shown in FIG. 1.
Figure 3:
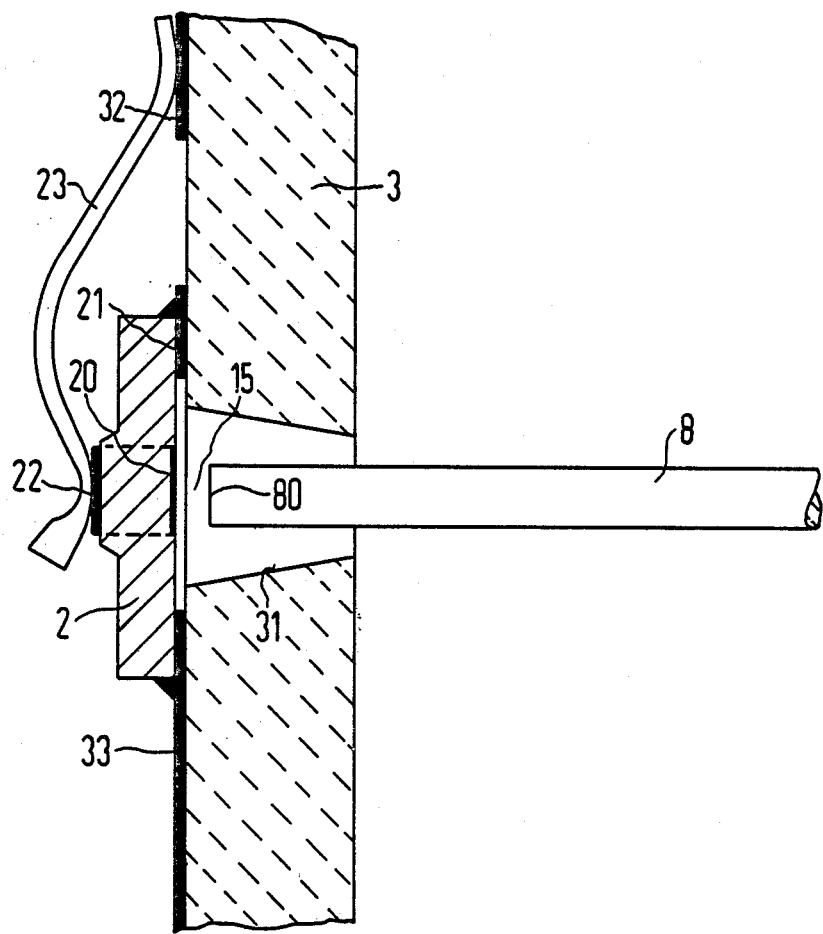
FIG. 3 is an enlarged view of a portion of FIG. 2.

FIG. 2 shows a topview of the circuit layout in FIG. 1, where the cover of metal casing 11 is removed and only a portion of the metal casing is shown. FIG. 3 shows a circuit module with a vertically mounted diode support.

Diode support 3 has the shape of a plate which is positioned vertically on circuit module 13.

Two angle brackets 1 and 1', which are located on the same side of support 3 as diode 2, are used for fastening support 3 to circuit module 13. Metal angle brackets 1 and 1' are connected to conductor tracks 130 and 130' on the circuit module 13 side. The conductor tracks of support 3 which connect angle brackets 1 and 1' to diode 2, are not shown in the figure. On support 3, a conductor track runs from bracket 1 to a connecting surface which is bonded to the anode of diode 2 by bond pad 23. A second conductor track runs from bracket 1' to the cathode of diode 2.

FIG. 3 shows a portion of FIG. 2, which provides further details about diode support 3 in the area of bore 31, and about the structure of PIN photodiode 2 as well as the bonding.

On two opposite surfaces, PIN photodiodes 2 has the ring-shaped n-bonding surface 21 and the centered ring-shaped p-bonding surface 22. PIN photodiode 2 has optical window 20 with a diameter of approximately 30 to 200 microns in the center of the ring-shaped backside bonding, and opposite of it, a bond pad 23 on the front side.

Optical fiber 8 extends into conical bore 31 which acts as lead-in 15. The lead-in becomes wider in the direction of diode 2 and therefore, little danger exists that the end face 80 of the optical fiber 8 will be bumped or damaged during its insertion into the lead-in or during positioning of the inner wall.

Preferably, the glass fiber is adjusted with reference to all three axes of the coordinate system in conjunction with a measurement of the photo current of the PIN diode. This adjustment is made for optimum light coupling while limiting the adjustment range in the axial direction of the glass fiber. With regard to the tolerances of support 3 and the bonding layer that must be taken into account, as well as with regard to the varying thermal expansion coefficients to be expected, a minimum distance between glass fiber 8 and window 20 of diode 2 of approximately 10 to 30 microns can prove to be a particularly practical limit value for the adjustment range.

Glass fiber 8 is neither permanently positioned nor bonded in lead-in 15. The diameter of lead-in 15 is approximately 100 microns larger at its narrowest point than metallized glass fiber 8 with a diameter of, for example 130 microns. The diameter of the end surfaces of the conical lead-in differ by approximately 100 microns.

The adjustment of glass fiber 8 on vertically positioned diode support 3 is substantially simplified by the special shape of the lead-in. During adjustment, the gripper is positioned between support 3 and block 5. This allows glass fiber 8 to be permanently positioned in an advantageous manner on block 5 in front of the gripper of the micro-manipulator.

Figure 4:
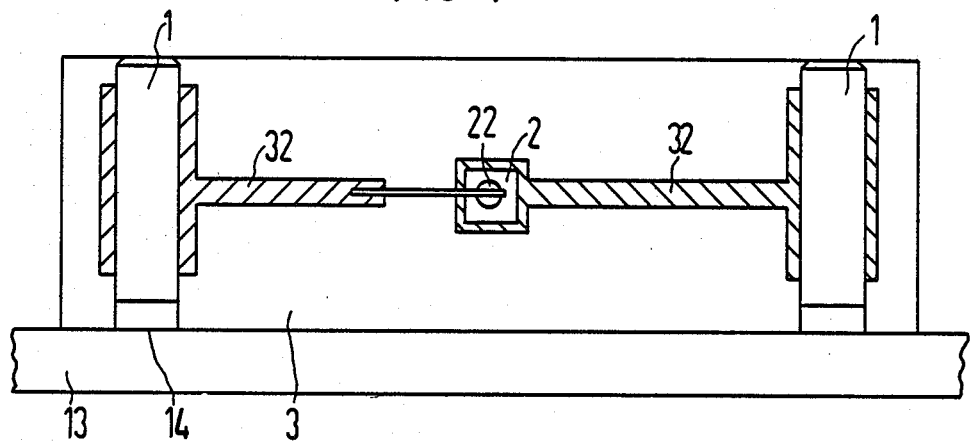
FIG. 4 is a diagrammatic view of a circuit module with a vertically positioned diode support.

As shown in FIG. 4, diode support 3 is plate-shaped and preferably made of ceramic.

The figures show a topview of the diode support side onto which metal angle brackets 1, shown in FIG. 1, are mounted. The ceramic plate is provided with large connecting surfaces 32 and 33 near its narrow sides from which conductor tracks run in the direction of the center of diode support 3. One of the conductor tracks surrounds bore 31 which is a laser-drilled hole, while the other one is a little shorter so that a PIN photodiode mounted in the laser-drilled hole does not come in contact with the shorter conductor track.

Diode support 3 consists of a small substratum with the necessary connections which has a laser-drilled hole 31 in its center. After attaching metal angle brackets 1, preferably by welding or soldering, PIN diode 2 is attached above bore 31 with a conductive adhesive applied around the edge of the hole. By using an electroconductive adhesive, the cathode connection of PIN photodiode 2 is produced. The anode of PIN photodiode 2 is made by bond pad 23.

This makes the diode connections accessible so that an electrical test, for dark current in particular, is possible without difficulties. PIN diode 2 can be tested electrically in an efficient way as a hybrid component immediately after being mounted onto diode support 3.

Subsequently, diode support 3 is welded and soldered vertically onto the completed and electrically pretested circuit module 13.

Figure 5:
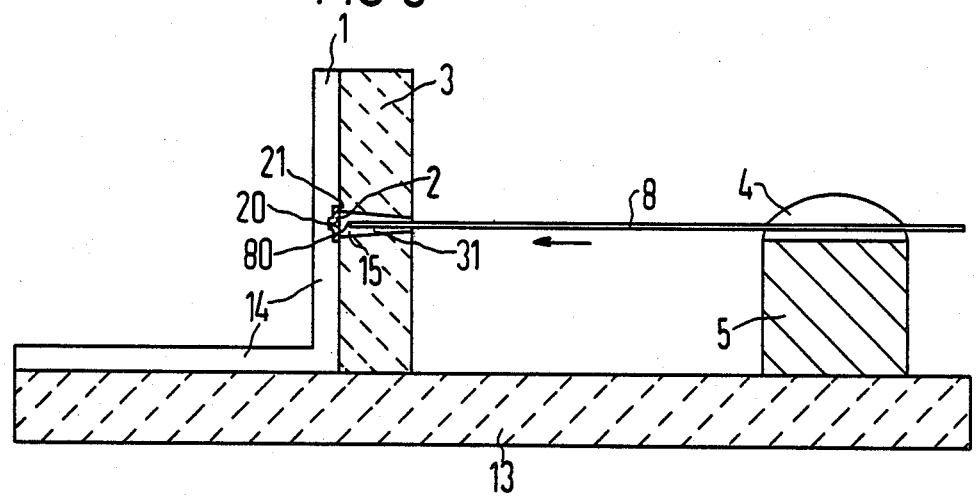
FIG. 5 is a cross-sectional view of the device shown in FIG. 1, with a diode support mounted on a circuit module and with a block for permanently positioning the optical fiber.

In the subsequent step of the manufacturing process, optical fiber 8, in the receiving device, is connected to PIN photodiode 2 shown in FIG. 5. For this purpose, glass fiber 8 is inserted into lead-in 15 using a micro-manipulator until a predefined distance from the optical window of PIN photodiode 2 is obtained. In this position, glass fiber 8 is adjusted for optimum light coupling and subsequently permanently positioned on block 5. To permanently position metallized glass fiber 8, it is soldered without flux material onto block 5 which serves as the support block.

Angle brackets 1 and 1' are connected to circuit module 13, preferably by welding. This procedure ensures that the connection of diode support 3 to circuit module 13 is maintained with the desired accuracy when permanently positioned glass fiber 8 on block 5, with hot gas soldering.

The electrical characteristics of the receiving device may be enhanced when electrical circuit components are mounted on the diode support in addition to diode 2, which provide an especially favorable interface between diode support 3 and circuit module 13. Such a circuit component could be a field effect transistor with a series resistor in the gate lead; the gate of which is connected to the anode of diode 2. In this case, four electrical connections are required for the electrical connection to the circuit module; one for the gate series resistor, two more for the drain connection and the source connection of the field effect transistor, and the fourth for the cathode of diode 2.

In this case, at least two of the angle brackets are welded for practical purposes. The remaining brackets can be connected to circuit module 13 by soldering.

After the optical fiber has been permanently positioned on block 5, connecting piece 7, shown in FIG. 1, is soldered to tubing 10 and glass fiber 8 is metallized from the front side to beyond connecting piece 9. The face 80 of glass fiber 8 is preferably a break point produced after the metallizing process, with the usual post-processing if necessary.

The receiving device shown in the figures contains a PIN photodiode as a receiving diode. For a transmitting device, a laser diode or light-emitting diode is used as a transmitting diode in place of the receiving diode.

There has thus been shown and described a novel transmitting/receiving device with a diode mounted on a support which fulfills all the object and advantages sought. Many changes, modifications, variations and other uses and application of the subject invention will, however, become apparent to those skilled in the art after considering this specification which discloses embodiments thereof. All such changes, modifications, variations and other uses and applications which do not depart from the spirit and scope of the invention are deemed to be covered by the invention which is limited only by the claims which follow.

What is claimed is:

1. In a transmitting/receiving device with a transmitting/receiving diode mounted on a support and with an optical fiber optically coupled to an optical window of the diode, where support is provided with a lead-in for insertion of the optical fiber, and the diode is mounted on the support so that the optical window of the diode is positioned at the lead-in, the improvement comprising said support mechanically connected to a circuit module and said optical fiber positioned over a positioning block which positioning block is also attached to said circuit module, and through said lead-in to said optical window, said optical fiber being permanently positioned and attached on said positioning block so that an end face of the optical fiber is a predefined distance away from said optical window, said lead-in having the shape of a cone so as to form a small and a large opening on a near and a far side respectively of said support and said diode being located on the far side of said support where the large opening is located, such that the optical fiber is positioned but not attached along the distance from the positioning block through the lead-in along its length to its end, the positioning block being mounted on the near side of the support sufficiently distant from the small opening of the support that a gripper or fiber manipulator may be introduced therebetween for optimizing the position of the fiber with respect to the diode optical window.

2. The transmitting/receiving device according to claim 1, wherein said support is square-shaped, and mounted vertically on the circuit module, said circuit module further supporting a block which forms the positioning device on the near side of the support and opposite from said diode on which block said optical fiber is permanently positioned and attached by a solder without the addition of a flux material.

3. The transmitting/receiving device according to claim 1, wherein said support is plate-shaped, and mounted vertically on the circuit module, said circuit module further supporting a block which forms a positioning device on the near side of the support and opposite from said diode on which block said optical fiber is permanently positioned and attached by a solder without the addition of a flux material.

4. The transmitting/receiving device according to claim 2, wherein said optical fiber is adjusted for optimum light coupling from said diode and then permanently positioned by the solder on said positioning device.

5. The transmitting/receiving device according to claim 1, wherein said diode further comprises a ring-shaped cathode connecting surface around a circular optical window and an anode connecting surface opposite said optical window, said cathode connecting surface bonded to an electrical conductor located on said support by means of an electro-conductive adhesive and to an additional electrical conductor located on said support by means of a bond pad, the diode connections being accessible for testing after mounting on the diode support.

6. The transmitting/receiving device according to claim 5, further comprising angle brackets provided for mechanical connection of said support to said circuit module, said brackets comprising an electro-conductive material, and said brackets electrically connected to electrical conductors of said support and to electrical conductors of said circuit module, said angle brackets being located on the same far side of the support as the diode.

7. The transmitting/receiving device according to claim 1, wherein said small and said large openings of said cone shaped lead-in have diameters which differ by approximately one-hundred microns, and wherein said small opening has a diameter of at least approximately one hundred microns greater than the diameter of said optical fiber.

* * * * *